United States Patent
Ishikawa et al.

(10) Patent No.: US 12,283,511 B2
(45) Date of Patent: Apr. 22, 2025

(54) MEMBER FOR SEMICONDUCTOR MANUFACTURING APPARATUS

(71) Applicant: NGK INSULATORS, LTD., Nagoya (JP)

(72) Inventors: Masaki Ishikawa, Handa (JP); Tatsuya Kuno, Nagoya (JP); Taro Usami, Kakamigahara (JP)

(73) Assignee: NGK INSULATORS, LTD., Nagoya (JP)

(*) Notice: Subject to any disclaimer, the term of this patent is extended or adjusted under 35 U.S.C. 154(b) by 197 days.

(21) Appl. No.: 18/302,981

(22) Filed: Apr. 19, 2023

(65) Prior Publication Data

US 2024/0153809 A1     May 9, 2024

Related U.S. Application Data

(63) Continuation of application No. PCT/JP2022/041481, filed on Nov. 8, 2022.

(51) Int. Cl.
| | | |
|---|---|---|
| *B32B 43/00* | (2006.01) | |
| *H01L 21/67* | (2006.01) | |
| *H01L 21/683* | (2006.01) | |

(52) U.S. Cl.
CPC .... *H01L 21/6833* (2013.01); *H01L 21/67103* (2013.01); *B32B 43/006* (2013.01); *Y10T 156/1153* (2015.01); *Y10T 156/1911* (2015.01)

(58) Field of Classification Search
CPC ............. H10L 21/6833; B32B 43/006; Y10T 156/1153; Y10T 156/1911
See application file for complete search history.

(56) References Cited

U.S. PATENT DOCUMENTS

| | | | |
|---|---|---|---|
| 11,935,767 B2 * | 3/2024 | Kobayashi | .......... H01L 21/3065 |
| 2002/0074646 A1 * | 6/2002 | Saika | ...................... H01L 23/38 |
| | | | 257/E23.102 |

(Continued)

FOREIGN PATENT DOCUMENTS

| | | |
|---|---|---|
| JP | 2008-103713 A | 5/2008 |
| JP | 2010-186765 A | 8/2010 |

(Continued)

OTHER PUBLICATIONS

International Search Report and Written Opinion (Application No. PCT/JP2022/041481) dated Jan. 10, 2023.

*Primary Examiner* — Philip C Tucker
*Assistant Examiner* — Nickolas R Harm
(74) *Attorney, Agent, or Firm* — BURR PATENT LAW, PLLC

(57) ABSTRACT

A member for a semiconductor manufacturing apparatus includes a ceramic plate; a composite plate joined to a lower surface of the ceramic plate; a cooling plate formed of a metal material, disposed on a lower surface of the composite plate; a first fastener that fastens the composite plate and the cooling plate; a support plate that is formed of an insulating material and supports a lower surface of the cooling plate; and a second fastener that fastens the cooling plate and the support plate, wherein, when the ceramic plate is heated from room temperature to high temperature, a first layered body including the ceramic plate and the composite plate deforms such that a central portion of the first layered body is convex, and a second layered body including the cooling plate and the support plate deforms such that a central portion of the second layered body is convex.

6 Claims, 4 Drawing Sheets

(56) References Cited

U.S. PATENT DOCUMENTS

| | | | |
|---|---|---|---|
| 2006/0279899 A1* | 12/2006 | Aihara | ............... H01L 21/6831 |
| | | | 361/234 |
| 2008/0138645 A1 | 6/2008 | Kawajiri et al. | |
| 2011/0292562 A1 | 12/2011 | Lee et al. | |
| 2016/0111315 A1 | 4/2016 | Parkhe | |
| 2016/0240422 A1* | 8/2016 | Takahashi | ............. H02N 13/00 |
| 2019/0189491 A1 | 6/2019 | Akatsuka | |
| 2019/0348316 A1 | 11/2019 | Hayashi | |

FOREIGN PATENT DOCUMENTS

| | | |
|---|---|---|
| JP | 2011-159678 A | 8/2011 |
| JP | 2013-529390 A | 7/2013 |
| JP | 2013-214606 A | 10/2013 |
| JP | 2017-126641 A | 7/2017 |
| JP | 2017-538278 A | 12/2017 |
| JP | 2019-197830 A | 11/2019 |
| JP | 2021-034412 A | 3/2021 |
| JP | 2022-119820 A | 8/2022 |
| WO | 2018/038044 A1 | 3/2018 |

* cited by examiner

MEMBER FOR SEMICONDUCTOR MANUFACTURING APPARATUS

BACKGROUND OF THE INVENTION

1. Field of the Invention

The present invention relates to a member for a semiconductor manufacturing apparatus.

2. Description of the Related Art

Electrostatic chuck assemblies are known in the prior art. For example, PTL 1 describes an electrostatic chuck assembly including: a puck including an upper puck plate and a lower puck plate bonded together; a cooling plate disposed on the lower surface of the lower puck plate; and fasteners that fasten together the lower puck plate and the cooling plate. The electrostatic chuck assembly is mounted on a mounting plate. Examples of the upper puck plate include ceramic plates, and examples of the lower puck plate include plates of electrically conductive metal matrix composite (MMC) materials i.e., composite plates. Examples of the cooling plate include metal plates. It is stated that the MMC material for the lower puck plate is selected such that its coefficient of thermal expansion (CTE) substantially matches the CTE of the upper puck plate over the operating temperature range. It is also stated that the CTE of the cooling plate matches the CTE of the puck.

CITATION LIST

Patent Literature

PTL 1: JP 2022-119820 A

SUMMARY OF THE INVENTION

However, in PTL 1, when the upper puck plate is heated from room temperature to high temperature (e.g., 180 to 220° C.), the puck, which is a layered body including the upper puck plate and the lower puck plate, deforms such that its central portion is convex, but, in some cases, the cooling plate mounted on the mounting plate deforms such that the central portion of the cooling plate is concave. In this case, it is feared that the lower puck plate may be pulled downward by the fasteners and broken.

The present invention has been made in order to solve the foregoing problem, and it is a main object to prevent the breakage of the composite plate.

[1] The member for a semiconductor manufacturing apparatus according to the present invention includes: a ceramic plate that is formed of a ceramic material and has a wafer placement portion on its upper surface; a composite plate that is formed of a composite material and joined to a lower surface of the ceramic plate; a cooling plate that is formed of a metal material, disposed on a lower surface of the composite plate, and includes a refrigerant flow path; a first fastener that fastens the composite plate and the cooling plate together; a support plate that is formed of an insulating material and supports a lower surface of the cooling plate; and a second fastener that fastens the cooling plate and the support plate together, wherein, when the ceramic plate is heated from room temperature to high temperature, a first layered body including the ceramic plate and the composite plate deforms such that a central portion of the first layered body is convex, and a second layered body including the cooling plate and the support plate fastened together using the second fastener deforms such that a central portion of the second layered body is convex.

In this member for a semiconductor manufacturing apparatus, when the ceramic plate is heated from room temperature to high temperature, the first layered body including the ceramic plate and the composite plate deforms such that the central portion of the first layered body is convex (i.e., the central portion is bowed upward). The second layered body including the cooling plate and the support plate fastened using the second fastener deforms such that the central portion of the second layered body is convex. Therefore, the composite plate is prevented from being pulled downward by the fasteners and prevented from being broken.

In the present description, up-down, right-left, front-rear, etc. may be used to describe the invention. However, these up-down, right-left, and front-rear merely represent relative positional relations. Therefore, when the orientation of the member for a semiconductor manufacturing apparatus is changed, the up-down positions may be changed to the left-right positions, or the left-right positions may be changed to the up-down positions. However, these are also included in the technical scope of the invention.

[2] In the above-described member for a semiconductor manufacturing apparatus (the member for a semiconductor manufacturing apparatus according to [1]), the coefficient of thermal expansion (CTE) of the composite plate may be substantially the same as the CTE of the ceramic plate, and the CTE of the cooling plate may be smaller than the CTE of the support plate. In this case, when the ceramic plate is heated from room temperature to high temperature, the first layered body including the ceramic plate and the composite plate deforms such that the central portion of the first layered body is convex, and the second layered body including the cooling plate and the support plate fastened using the second fastener deforms such that the central portion of the second layered body is convex. In the present description, each CTE is a value at 20 to 200° C.

[3] In the above-described member for a semiconductor manufacturing apparatus (the member for a semiconductor manufacturing apparatus according to [1] or [2]), the absolute value of the difference between the CTE of the composite plate and the CTE of the ceramic plate may be $1\times10^{-6}$/K or less, and the CTE of the cooling plate may be smaller by from $1\times10^{-6}$/K to $3\times10^{-6}$/K than the CTE of the support plate.

[4] The above-described member for a semiconductor manufacturing apparatus (the member for a semiconductor manufacturing apparatus according to any one of [1] to [3]) may include a plurality of the second fasteners disposed along each of two or more concentric circles having different diameters. In this case, the lower surface of the cooling plate is strongly restrained by the support plate, so that the deformation of one of the support plate and the cooling plate strongly influences the other.

[5] In the above-described member for a semiconductor manufacturing apparatus (the member for a semiconductor manufacturing apparatus according to any one of [1] to [4]), the ceramic material may be alumina, and the composite material may be SiSiCTi. The metal material may be molybdenum, and the insulating material may be alumina. By selecting the above combination of materials, the effects of the invention can be easily obtained.

[6] In the above-described member for a semiconductor manufacturing apparatus (the member for a semiconductor manufacturing apparatus according to any one of [1] to [5]), the first fastener may be made of titanium. In this case, the stress generated in a portion of the composite plate that is fastened by the first fastener can be reduced.

DETAILED DESCRIPTION OF THE INVENTION

Figure 1:
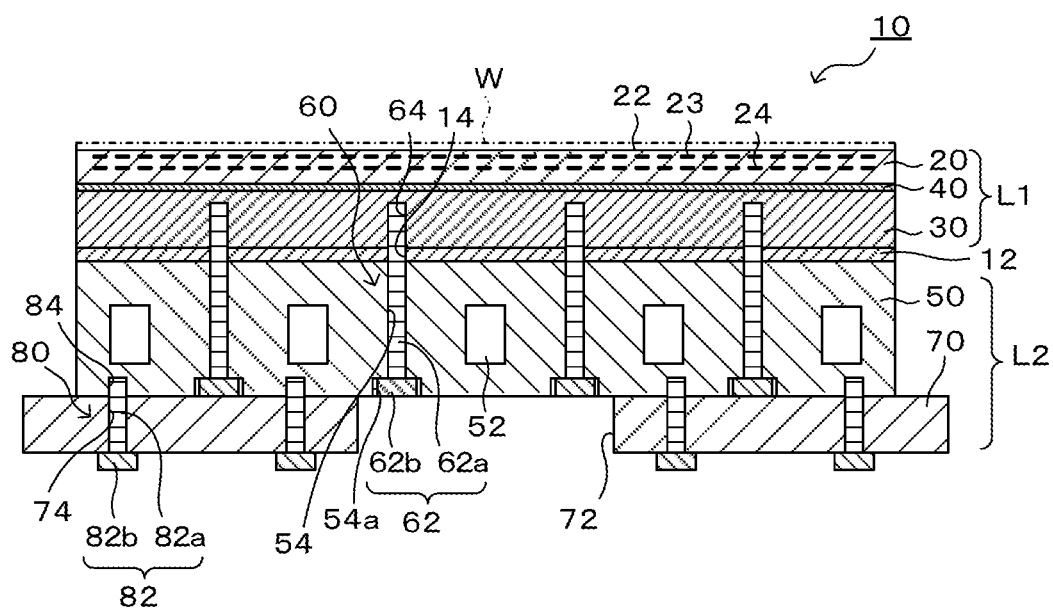
FIG. 1 is a vertical cross-sectional view of a member 10 for a semiconductor manufacturing apparatus.
Figure 2:
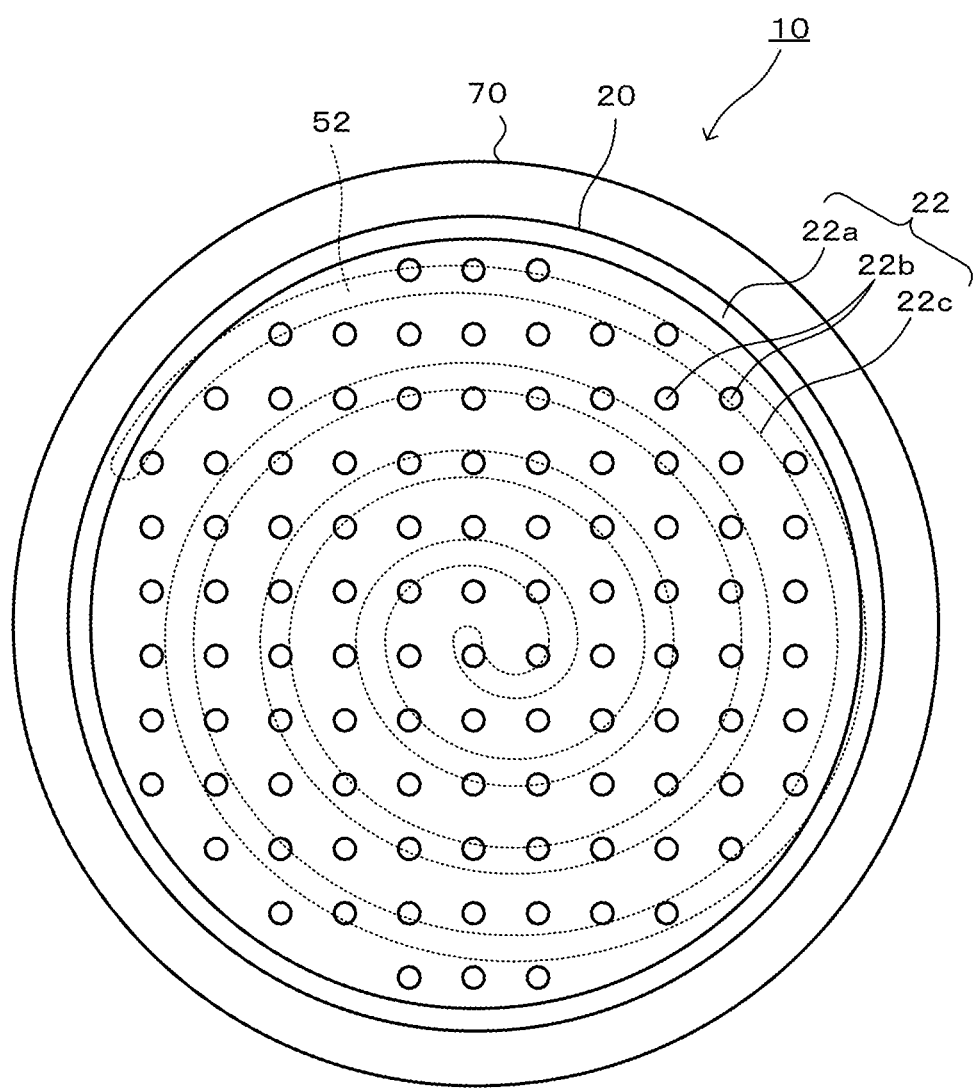
FIG. 2 is a plan view of the member 10 for a semiconductor manufacturing apparatus.
Figure 3:
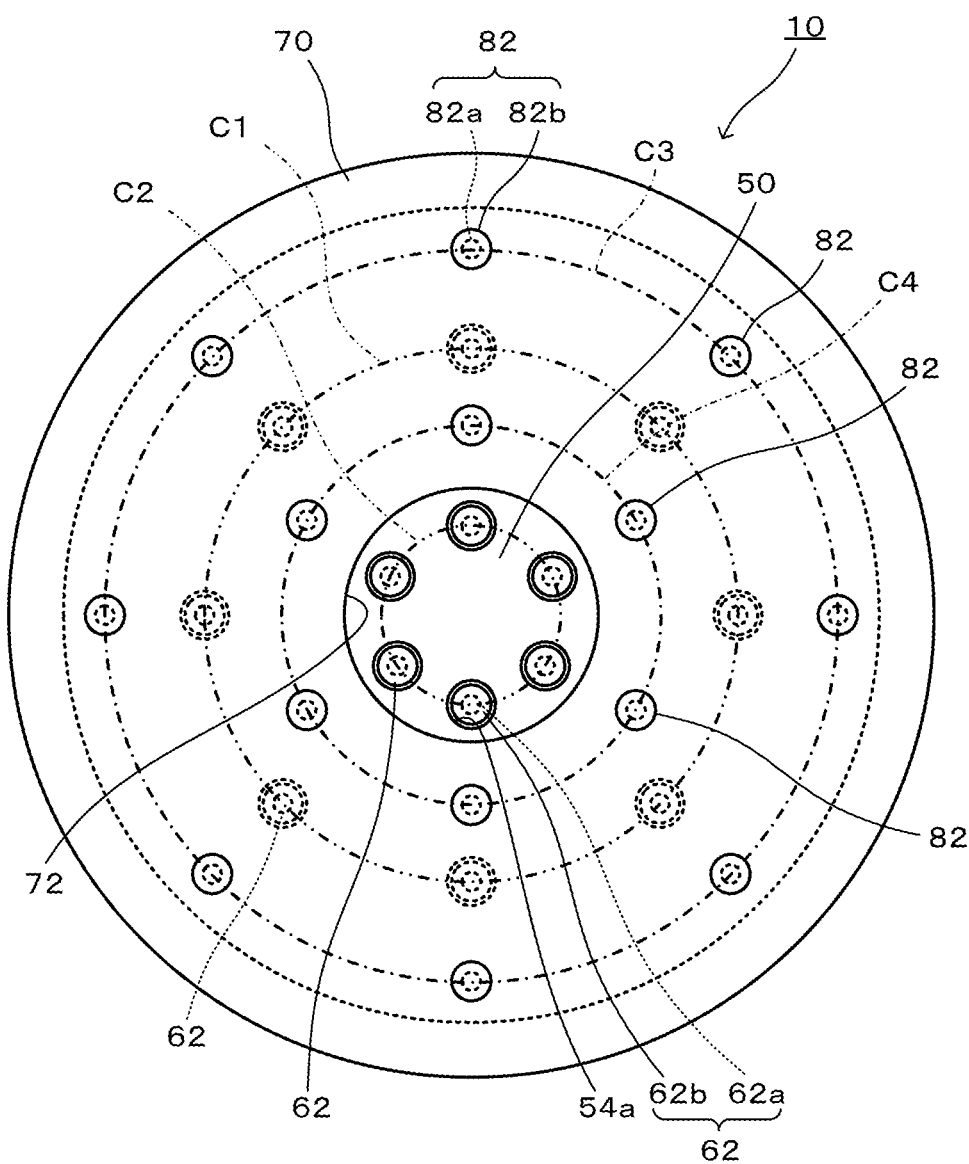
FIG. 3 is a bottom view of the member 10 for a semiconductor manufacturing apparatus.

Next, a preferred embodiment of the present invention will be described using the drawings. FIG. 1 is a vertical cross-sectional view of a member 10 for a semiconductor manufacturing apparatus (a cross-sectional view when the member 10 for a semiconductor manufacturing apparatus is cut along a plane including the center axis of a ceramic plate 20), and FIG. 2 is a plan view of the member 10 for a semiconductor manufacturing apparatus. FIG. 3 is a bottom view of the member 10 for a semiconductor manufacturing apparatus.

The member 10 for a semiconductor manufacturing apparatus is used to subject a wafer W to CVD or etching using plasma. The member 10 for a semiconductor manufacturing apparatus includes the ceramic plate 20, a composite plate 30, a cooling plate 50, first fasteners 60, a support plate 70, and second fasteners 80.

The ceramic plate 20 is a disk member formed of a ceramic material typified by alumina, aluminum nitride, etc. and has a wafer placement portion 22 on its upper surface. A wafer W is to be placed on the wafer placement portion 22. As shown in FIG. 2, a seal band 22a is formed along the outer edge of the wafer placement portion 22, and a plurality of small circular protrusions 22b are formed over the entire region surrounded by the seal band 22a. The seal band 22a and the small circular protrusions 22b have the same height, and the height is, for example, several µm to several tens of µm. A portion of the wafer placement portion 22 in which the seal band 22a and the small circular protrusions 22b are not provided is referred to as a reference surface 22c.

An electrostatic electrode 23 is a flat mesh electrode embedded in a region corresponding to substantially the entire upper surface of the ceramic plate 20, and a DC voltage can be applied to the electrostatic electrode 23. When a DC voltage is applied to the electrostatic electrode 23, a wafer W is attracted and fixed to the wafer placement portion 22 (specifically, the upper surface of the seal band 22a and the upper surfaces of the small circular protrusions 22b) by electrostatic attraction force. When the application of the DC voltage is terminated, the wafer W attracted and fixed to the wafer placement surface 22 is released. A heater electrode 24 is a heater line (resistance heating element) that is formed in a one-stroke pattern from its one end to the other end in a region corresponding to substantially the entire upper surface of the ceramic plate 20. When a current is applied to the heater line of the heater electrode 24, the heater line generates heat, and the wafer W is heated. Examples of the material forming the electrostatic electrode 23 and the heater electrode 24 include tungsten, molybdenum, tungsten carbide, molybdenum carbide, and mixtures of these materials and ceramic powders.

The composite plate 30 is a disk member formed of a metal-ceramic composite material and is joined to the lower surface of the ceramic plate 20 with a metal joint layer 40 therebetween. The CTE of the composite plate 30 is substantially the same as the CTE of the ceramic plate 20. For example, the absolute value of the difference between the CTEs of these plates is preferably $1 \times 10^{-6}$/K or less and more preferably $0.5 \times 10^{-6}$/K or less. Examples of the metal-ceramic composite material include metal matrix composite materials (MMCs) and ceramic matrix composite materials (CMCs). Specific examples of these composite materials include materials containing Si, SiC, and Ti, materials prepared by impregnating SiC porous bodies with Al and/or Si, and $Al_2O_3$—TiC composite materials. The material containing Si, SiC, and Ti is referred to as SiSiCTi. The material prepared by impregnating a SiC porous body with Al is referred to as AlSiC, and the material prepared by impregnating a SiC porous body with Si is referred to as SiSiC.

The composite material used for the composite plate 30 is preferably a material whose CTE is close to the CTE of the ceramic plate 20. When the ceramic plate 20 is made of alumina, the composite plate 30 is made of preferably SiSiCTi. This is because the CTE of SiSiCTi can be adjusted to be substantially the same as the CTE of alumina. The disk member made of SiSiCTi can be produced, for example, as follows. First, silicon carbide, metallic Si, and metallic Ti are mixed to produce a powder mixture. Then the obtained powder mixture is subjected to uniaxial press forming to produce a disk-shaped molded body, and the molded body is subjected to hot-press sintering in an inert atmosphere to obtain a SiSiCTi-made disk member.

The metal joint layer 40 joins together the lower surface of the ceramic plate 20 and the upper surface of the composite plate 30. The metal joint layer 40 may be a layer formed of, for example, solder or a metallic brazing material. The metal joint layer 40 is formed, for example, by TCB (thermal compression bonding). The TCB is a well-known method in which a metallic joint member is held between two members to be joined together and the two members are heated to a temperature equal to or lower than the solidus temperature of the metallic joint member to pressure-bond the two members together.

A layered body prepared by joining together the ceramic plate 20 and the composite plate 30 with the metal joint layer 40 therebetween is referred to as a first layered body L1.

The cooling plate 50 is a disk member formed of a metal material and is attached to the lower surface of the composite plate 30 with a heat dissipating sheet 12 therebetween. The cooling plate 50 includes a refrigerant flow path 52 through which a refrigerant can circulate. As shown in FIG. 2, the refrigerant flow path 52 is disposed in a one-stroke pattern from its one end (inlet) to the other end (outlet) in plan view over the entire surface of the ceramic plate 20. In the present embodiment, the refrigerant flow path 52 is formed into a spiral pattern in plan view. The refrigerant is supplied from an unillustrated refrigerant circulating device to one end (inlet) of the refrigerant flow path 52, passes through the refrigerant flow path 52, is discharged from the other end (outlet) of the refrigerant flow path 52, and returned to the refrigerant circulating device. The refrigerant circulating device can adjust the temperature of the refrigerant to a desired temperature. The refrigerant is preferably a liquid and is preferably electrically insulative. Examples of the electrically insulating liquid include fluorine-based inert liquids.

The heat dissipating sheet 12 is held between the composite plate 30 and the cooling plate 50 and compressed in the vertical direction. Specifically, the heat dissipating sheet 12 is preferably a sheet containing carbon and a resin. Examples of the carbon include graphite, carbon fibers, and carbon nanotubes, and examples of the resin include silicone resins. When the carbon is graphite, it is preferable to dispose it such that the plane direction of graphene included in the graphite extends along the vertical direction. When the carbon is carbon fibers or carbon nanotubes, it is preferable to dispose them such that their axial direction extends along the vertical direction. For example, a thermal interface material (TIM) may be used as the material of the heat dissipating sheet 12. Specific example of the heat dissipating sheet 12 include: EX20000C9 series and EX20000C4S series (manufactured by Dexerials Corporation); and Graphite PAD and Graphite TIM (registered trademark) (manufactured by Panasonic Industry Co., Ltd.). A seal ring (O-ring) may be disposed on the outer circumference of the heat dissipating sheet 12.

Each of the first fasteners 60 includes a male thread 62 and a female thread 64. The male thread 62 has a thread shank portion 62a and a thread head portion 62b having a larger diameter than the thread shank portion 62a. The thread shank portion 62a passes from the lower surface of the cooling plate 50 through a through hole 54 vertically piercing the cooling plate 50 and through a round hole 14 in the heat dissipating sheet 12 and is screwed into the female thread 64 formed on the lower surface of the composite plate 30. The female thread 64 may be formed directly in the composite plate 30 or may be a threaded insert embedded in the composite plate 30. The thread head portion 62b is housed in a recessed portion 54a formed on the lower surface of the cooling plate 50. The recessed portion 54a is a large-diameter aperture portion of the through hole 54 that has an opening on the lower surface of the cooling plate 50. The through hole 54 is formed so as not to overlap the refrigerant flow path 52 in the cooling plate 50. The plurality of first fasteners 60 are disposed along each of two or more concentric circles having different diameters. In the present embodiment, as shown in FIG. 3, the first fasteners 60 are disposed on two circles concentric with the cooling plate 50 and having different diameters. Specifically, a plurality of (e.g., eight or twelve) first fasteners 60 are disposed at regular intervals along a large circle C1, and a plurality of (e.g., six or eight) first fasteners 60 are disposed at regular intervals along a small circle C2. Each male thread 62 may be formed of a metal such as stainless steel or titanium and is formed of preferably titanium.

The support plate 70 is an annular member formed of an insulating material and supports the lower surface of the cooling plate 50. The support plate 70 is a member forming part of a semiconductor process chamber. The support plate 70 has a circular hole 72 at the center that is used for insertion of, for example, members for power supply to the electrostatic electrode 23 and the heater electrode 24. The insulating material used may be a ceramic material such as alumina or aluminum nitride.

The CTE of the cooling plate 50 is smaller than the CTE of the support plate 70. Preferably, the CTE of the cooling plate 50 is smaller by from $1\times10^{-6}$/K to $3\times10^{-6}$/K than the CTE of the support plate 70. When, for example, the support plate 70 is made of alumina, it is preferable that the cooling plate 50 is made of molybdenum. Preferably, the CTE of the cooling plate 50 is close to the CTE of the ceramic plate 20 and the CTE of the composite plate 30 (e.g., the difference in CTE is $3\times10^{-6}$/K or less).

Each of the second fasteners 80 includes a male thread 82 and a female thread 84. The male thread 82 has a thread shank portion 82a and a thread head portion 82b having a larger diameter than the thread shank portion 82a. The thread shank portion 82a passes from the lower surface of the support plate 70 through a through hole 74 vertically piercing the support plate 70 and is screwed into the female thread 84 formed on the lower surface of the cooling plate 50. The female thread 84 may be formed directly in the cooling plate 50 or may be a threaded insert embedded in the cooling plate 50. The thread head portion 82b is in contact with the lower surface of the support plate 70 (the opening edge of the through hole 74). The plurality of second fasteners 80 are disposed along each of two or more concentric circles having different diameters. In the present embodiment, as shown in FIG. 3, the second fasteners 80 are disposed on two circles concentric with the support plate 70 and having different diameters. Specifically, a plurality of (e.g., eight or twelve) second fasteners 80 are disposed at regular interval along a large circle C3, and a plurality of (e.g., six or eight) second fasteners 80 are disposed at regular interval along a small circle C4. Each male thread 82 may be formed of a metal such as stainless steel or titanium.

A layered body prepared by fastening the cooling plate 50 and the support plate 70 together using the second fasteners 80 is referred to as a second layered body L2.

A preferred combination of the materials of the above members is as follows. The material of the ceramic plate 20 is alumina (CTE: 6 to $7\times10^{-6}$/K), and the material of the composite plate 30 is SiSiCTi (CTE: $7\times10^{-6}$/K). The material of the cooling plate 50 is molybdenum (CTE: $5\times10^{-6}$/K), and the material of the support plate 70 is alumina (CTE: 6 to $7\times10^{-6}$/K). The material of the first fasteners 60 is titanium (CTE: $8.8\times10^{-6}$/K).

Next, an example of the use of the member 10 for a semiconductor manufacturing apparatus will be described. The member 10 for a semiconductor manufacturing apparatus is placed inside a semiconductor process chamber (not shown). The support plate 70 is a member forming part of the chamber. A wafer W is placed on the wafer placement portion 22. In this state, a DC voltage is applied to the electrostatic electrode 23 to attract the wafer to the wafer placement portion 22. At the same time, a current is applied to the heater electrode 24 to heat the wafer W to a prescribed temperature (e.g., 100° C.). The inside of the chamber is evacuated to a prescribed vacuum atmosphere (or a reduced pressure atmosphere), and an RF voltage is applied to the cooling plate 50 while a process gas is supplied from a shower head (not shown) disposed in a ceiling portion of the chamber. Then plasma is generated between the wafer W and the shower head. The plasma is used to form a film on the wafer W by CVD or to etch the wafer W. Since heat is inputted to the wafer W from the plasma, the refrigerant at a low temperature (e.g., −30° C.) is caused to flow through the refrigerant flow path 52, and the electric power supplied to the heater electrode 24 is adjusted such that the temperature of the wafer W is held at a prescribed temperature as needed.

The member 10 for a semiconductor manufacturing apparatus is completed by fastening the first layered body L1 and the cooling plate 50 together using the first fasteners 60 at room temperature (normal room temperature) and then fastening the cooling plate 50 and the support plate 70 together using the second fasteners 80 at room temperature. Therefore, at room temperature, the first layered body L1 and also the second layered body L2 are flat.

Figure 4:
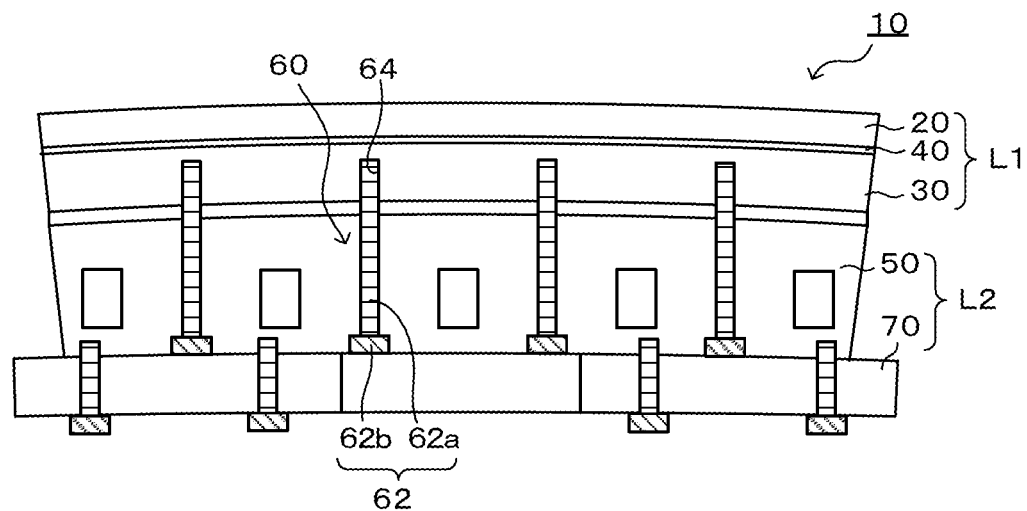
FIG. 4 is a schematic illustration showing the state of the member 10 for a semiconductor manufacturing apparatus when a ceramic plate 20 is heated from room temperature to high temperature.

As the wafer W placed on the wafer placement portion 22 and the ceramic plate 20 are heated from room temperature to a prescribed temperature (e.g., 100° C.) and the refrigerant at low temperature (e.g., −30° C.) is caused to flow through the refrigerant flow path 52, the temperature of the ceramic plate 20 in the first layered body L1 increases, but the temperature of the composite plate 30 is maintained low. Although the CTE of the ceramic plate 20 and the CTE of the composite plate 30 are substantially the same, the expansion of the ceramic plate 20 is larger than the expansion of the composite plate 30 because of the temperature difference therebetween. Therefore, the first layered body L1 deforms such that its central portion is convex. Meanwhile, the temperature of the second layered body L2 as a whole is low. Since the CTE of the cooling plate 50 is smaller than the CTE of the support plate 70, the contraction of the support plate 70 is larger than the contraction of the cooling plate 50. Therefore, the second layered body L2 also deforms such that its central portion is convex. This state is shown in FIG. 4. When the wafer W is cooled from the prescribed temperature, the first layered body L1 and also the second layered body L2 deform such that their central portions are convex. Since both the first layered body L1 and the second layered body L2 deform such that their central portions are convex as described above, the male threads 62 of the first fasteners 60 do not strongly pull the female threads 64 of the composite plate 30 downward.

Figure 5:
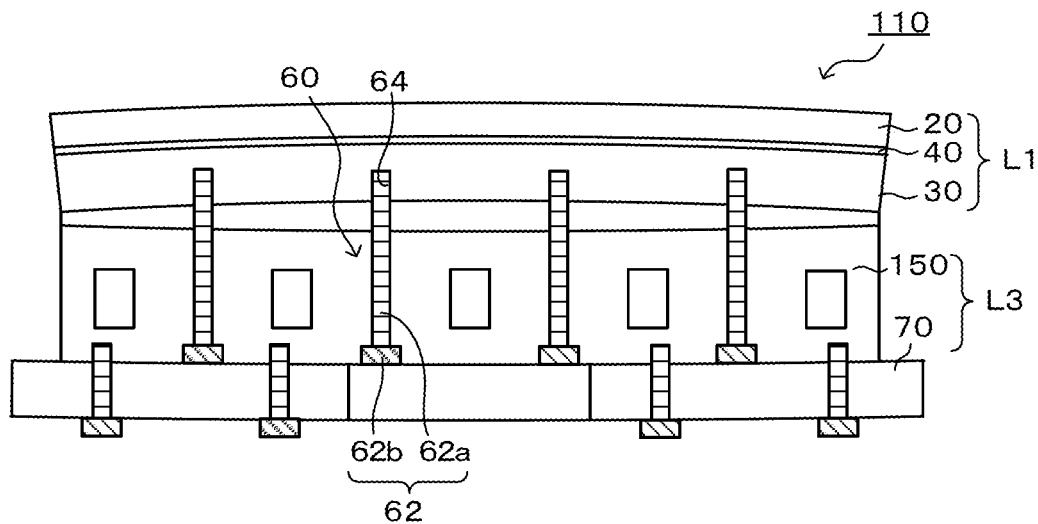
FIG. 5 is a schematic illustration showing the state of a member 110 for a semiconductor manufacturing apparatus when the ceramic plate 20 is heated from room temperature to high temperature.

A member 110 for a semiconductor manufacturing apparatus shown in FIG. 5 is an example in which, instead of the cooling plate 50, a cooling plate 150 whose CTE is larger than the CTE of the support plate 70 is used (for example, the support plate 70 is made of alumina and the cooling plate 150 is made of an aluminum alloy (A6061)). In this example, when a wafer W placed on the wafer placement portion 22 and the ceramic plate 20 are heated from room temperature to a prescribed temperature and the low-temperature refrigerant is caused to flow through the refrigerant flow path 52, the first layered body L1 deforms such that its central portion is convex. Meanwhile, the temperature of a second layered body L3 as a whole (a layered body including the cooling plate 150 and the support plate 70 fastened together using the second fasteners 80) is low. In this case, since the CTE of the cooling plate 150 is larger than the CTE of the support plate 70, the contraction of the cooling plate 150 is larger than the contraction of the support plate 70. Therefore, the second layered body L3 deforms such that its central portion is concave. The state in this case is shown in FIG. 5. In this case, the male threads 62 of the first fasteners 60 pull strongly the female threads 64 of the composite plate 30 downward. Therefore, it is feared that the composite plate 30 may break.

When the CTE of the cooling plate 50 is equal to the CTE of the support plate 70, although the first layered body L1 deforms such that its central portion is convex, the second layered body L2 is flat. In this case also, the male threads 62 of the first fasteners 60 strongly pull the female threads 64 of the composite plate 30 downward, and it is therefore feared that the composite plate 30 may break.

In the above-described member 10 for a semiconductor manufacturing apparatus, when the ceramic plate 20 is heated from room temperature to high temperature (e.g., 180 to 220° C.), the layered body (the first layered body L1) including the ceramic plate 20 and the composite plate 30 deforms such that its central portion is convex. The layered body (the second layered body L2) including the cooling plate 50 and the support plate 70 fastened together using the second fasteners 80 also deforms such that its central portion is convex. Therefore, the composite plate 30 is prevented from being pulled downward by the first fasteners 60, and the breakage of the composite plate 30 can be prevented.

The CTE of the composite plate 30 is substantially the same as the CTE of the ceramic plate 20, and the CTE of the cooling plate 50 is smaller than the CTE of the support plate 70. Therefore, when the ceramic plate 20 is heated from room temperature to high temperature, both the first layered body L1 and the second layered body L2 deform such that their central portions are convex.

Moreover, the plurality of second fasteners 80 are disposed along each of two or more concentric circles having different diameters. Therefore, the lower surface of the cooling plate 50 is strongly restrained by the support plate 70, so that the deformation of one of the support plate 70 and the cooling plate 50 strongly influences the other.

Moreover, it is preferable that the material of the ceramic plate 20 is alumina, that the material of the composite plate 30 is SiSiCTi, that the material of the cooling plate 50 is molybdenum, and that the material of the support plate 70 is alumina. In this case, the effects of the invention can be easily obtained. It is preferable that the material of the first fasteners 60 is titanium. In this case, the stress generated in the female threads 64 of the composite plate 30 can be further reduced.

The present invention is not limited to the embodiment described above. It will be appreciated that the present invention can be embodied in various forms so long as they fall within the technical scope of the invention.

In the embodiment described above, the annular member is exemplified as the support plate 70, but the invention is not particularly limited thereto. For example, a circular member having no hole at the center may be used as the support plate 70.

In the embodiment described above, the electrostatic electrode 23 and the heater electrode 24 are embedded in the ceramic plate 20, but the invention is not particularly limited thereto. For example, the electrostatic electrode 23, the heater electrode 24, and at least one RF electrode for plasma generation may be embedded in the ceramic plate 20.

In the embodiment described above, a gas flow path for supplying a gas (e.g., a thermally conductive gas such as He) through the lower surface of the cooling plate 50 to the lower surface of the wafer W placed on the wafer placement portion 22 may be provided in the member 10 for a semiconductor manufacturing apparatus. Lift pin holes for insertion of lift pins for lifting the wafer W placed on the wafer placement portion 22 may be formed so as to pass through the cooling plate 50 from its lower surface and extend to the wafer placement portion 22.

In the embodiment described above, the ceramic plate 20 may have a circular wafer placement portion 22 at the center and have an annular focusing ring placement portion on the outer circumference of the wafer placement portion 22. The focusing ring placed on the focusing ring placement portion plays a role in generating plasm stably also in the outer circumferential edge of the wafer W and a role in protecting the ceramic plate 20.

In the embodiment described above, the refrigerant flow path 52 is formed into a spiral pattern in plan view, but the invention is not particularly limited thereto. The refrigerant flow path 52 may be formed, for example, in a zig-zag pattern in plan view.

In the embodiment described above, the ceramic plate 20 and the composite plate 30 are joined together with the metal joint layer 40 therebetween. However, a resin bonding layer may be used instead of the metal joint layer 40.

In the embodiment described above, the heat dissipating sheet 12 intervenes between the composite plate 30 and the cooling plate 50. However, instead of the heat dissipating sheet 12, a seal ring (O-ring) having the same outer diameter as those of these plates 30 and 50 may intervene therebetween.

International Application No. PCT/JP2022/041481, filed on Nov. 8, 2022, is incorporated herein by reference in its entirety.

What is claimed is:

1. A member for a semiconductor manufacturing apparatus, the member comprising:
    a ceramic plate that is formed of a ceramic material and has a wafer placement portion on its upper surface;
    a composite plate that is formed of a composite material and joined to a lower surface of the ceramic plate;
    a cooling plate that is formed of a metal material, disposed on a lower surface of the composite plate, and includes a refrigerant flow path;
    a first fastener that fastens the composite plate and the cooling plate together;
    a support plate that is formed of an insulating material and supports a lower surface of the cooling plate; and
    a second fastener that fastens the cooling plate and the support plate together,
    wherein, when the ceramic plate is heated from room temperature to high temperature, a first layered body including the ceramic plate and the composite plate deforms such that a central portion of the first layered body is convex, and a second layered body including the cooling plate and the support plate fastened together using the second fastener deforms such that a central portion of the second layered body is convex.

2. The member for a semiconductor manufacturing apparatus according to claim 1, wherein the coefficient of thermal expansion of the composite plate is substantially the same as the coefficient of thermal expansion of the ceramic plate, and
    wherein the coefficient of thermal expansion of the cooling plate is smaller than the coefficient of thermal expansion of the support plate.

3. The member for a semiconductor manufacturing apparatus according to claim 2, wherein the absolute value of the difference between the coefficient of thermal expansion of the composite plate and the coefficient of thermal expansion of the ceramic plate is $1\times10^{-6}$/K or less, and
    wherein the coefficient of thermal expansion of the cooling plate is smaller by from $1\times10^{-6}$/K to $3\times10^{-6}$/K than the coefficient of thermal expansion of the support plate.

4. The member for a semiconductor manufacturing apparatus according to claim 1, wherein the member for a semiconductor manufacturing apparatus comprises a plurality of the second fasteners disposed along each of two or more concentric circles having different diameters.

5. The member for a semiconductor manufacturing apparatus according to claim 1, wherein the ceramic material is alumina,
    wherein the composite material is SiSiCTi,
    wherein the metal material is molybdenum, and
    wherein the insulating material is alumina.

6. The member for a semiconductor manufacturing apparatus according to claim 5, wherein the first fastener is made of titanium.

* * * * *